United States Patent
Park

(10) Patent No.: US 6,843,809 B2
(45) Date of Patent: Jan. 18, 2005

(54) VACUUM/PURGE OPERATION OF LOADLOCK CHAMBER AND METHOD OF TRANSFERRING A WAFER USING SAID OPERATION

(75) Inventor: Bong-Jin Park, Osan (KR)

(73) Assignee: Samsung Electronics Co., Ltd., Suwon-si (KR)

(*) Notice: Subject to any disclaimer, the term of this patent is extended or adjusted under 35 U.S.C. 154(b) by 75 days.

(21) Appl. No.: 10/422,793

(22) Filed: Apr. 25, 2003

(65) Prior Publication Data

US 2004/0083588 A1 May 6, 2004

(30) Foreign Application Priority Data

Oct. 22, 2002 (KR) ................................ 10-2002-0064455

(51) Int. Cl.[7] .......................... H01L 21/00; H01I 21/64
(52) U.S. Cl. .................... 29/25.01; 118/50; 438/908
(58) Field of Search .................. 29/25.01; 204/298.25, 204/298.35; 118/50, 719; 438/908

(56) References Cited

U.S. PATENT DOCUMENTS

| | | | |
|---|---|---|---|
| 4,643,627 A | * | 2/1987 | Bednorz et al. ............ 414/217 |
| 6,039,770 A | | 3/2000 | Yang et al. ................. 29/25.01 |
| 6,216,548 B1 | | 4/2001 | Park et al. ................. 73/863.02 |
| 6,323,463 B1 | * | 11/2001 | Davis et al. ................ 219/390 |
| 6,410,889 B2 | * | 6/2002 | Davis et al. ................ 219/390 |

* cited by examiner

Primary Examiner—George Fourson
Assistant Examiner—Fernando L. Toledo
(74) Attorney, Agent, or Firm—Volentine Francos & Whitt, P.L.L.C.

(57) ABSTRACT

A vacuum/purge operation of a loadlock chamber prevents an eddy phenomenon from occurring in the chamber and thereby prevents wafers from being polluted and damaged by particles in the chamber. A vacuum pump for providing the loadlock chamber with vacuum pressure, and a gas supply for providing the chamber with purge gas are connected to the loadlock chamber by an exhaust line and a gas supply line, respectively. At least one control valve is installed in each of the lines. At the time the state of pressure in the loadlock chamber is to be changed, the loadlock chamber is provided with both the vacuum pressure and the purge gas at rates that are inter-dependent to establish a flow of gases towards and into the exhaust line. Then, the supplying of one of the vacuum pressure and the purge gas is gradually reduced and cut off.

14 Claims, 5 Drawing Sheets

VACUUM/PURGE OPERATION OF LOADLOCK CHAMBER AND METHOD OF TRANSFERRING A WAFER USING SAID OPERATION

BACKGROUND OF THE INVENTION

1. Field of the Invention

The present invention relates to the fabrication of semiconductor devices. More particularly, the present invention relates to a loadlock chamber of semiconductor manufacturing apparatus and to a method of controlling the pressure in the chamber in the course of transferring wafers to and from the chamber.

2. Description of the Related Art

In general, a semiconductor device is fabricated by subjecting a wafer to such selective and repetitive processes as photolithography, etching, diffusion, chemical vapor deposition (CVD), ion implantation and metal evaporation processes. To this end, the wafer is mounted on a cassette, and the cassette is transferred to respective fabricating equipment for processing the wafers. Also, the wafers are transferred by a robot into position in the fabricating equipment.

A loadlock chamber is typically used in such a transfer of wafers to allow the processing conditions, e.g., pressure, within the fabricating equipment to be maintained while the wafers are moved in and out of the fabricating equipment. That is, the pressure within the loadlock chamber is regulated to provide a buffer between the atmospheric pressure prevailing in the production line outside the fabricating equipment and the vacuum pressure atmosphere within the fabricating equipment. To this end, the interior of the loadlock chamber is purged or filled with gas during the course of transferring the wafers to and from the fabricating equipment. A conventional technique of purging/filling the loadlock chamber will be described with reference to the FIGS. 1 and 2.

First, as shown in FIG. 1, a general loadlock chamber 10 includes a first door 12a adjacent a production line and a second door 12b adjacent a process chamber 14 or a transfer chamber 16. The first door 12a can be selectively opened and closed so that the cassette C having numerous wafers therein can be introduced into and withdrawn from the processing equipment. The second door 12b can be selectively opened and closed so that the wafers W can be introduced into or withdrawn from the process chamber 14 or transfer chamber 16. A vacuum pressure atmosphere is maintained with the process chamber 14 or transfer chamber 16.

The loadlock chamber 10 is connected to a vacuum pump 18 and an exhaust line 20 at one side thereof. The vacuum pump 18 is operative to produce a vacuum within the loadlock chamber 10. On the other hand, a gas supply 22 for supplying a purge gas to the interior of the loadlock chamber 10 is connected through a gas supply line 24 to another portion of the loadlock chamber 10. Control valves 26a, 26b for controlling a flow of fluid in response to a signal generated by a controller (not shown in the drawings) are respectively installed in the exhaust line 20 and the gas supply line 24.

The vacuum/purge operations of the loadlock chamber 10 will be described now with reference to FIG. 2.

The cassette C having numerous wafers W mounted therein is transferred from the production line into the loadlock chamber 10 while the first door 12a is open (ST100). Then the controller closes the first door 12a to thus seal off the atmosphere within the loadlock chamber 10 (ST102).

Subsequently, while the gas supply line 24 is cut off by the control valve 26b, the controller controls the vacuum pump 18 and the control valve 26a such that air is withdrawn from the loadlock chamber 10 through exhaust line 20. Thus, a vacuum (negative pressure) is produced within the loadlock chamber 10 (ST104). At the same time, the pressure within the loadlock chamber 10 is measured by a sensing unit (not shown in the drawings). The controller uses the sensed pressure to determine when the pressure has reached a predetermined level, namely, a level corresponding to that within the process chamber 14 or transfer chamber 16 (ST106).

Once the pressure in the loadlock chamber 10 has reached the predetermined level, the controller opens the second door 12b (ST108), and controls a robot R provided within the process chamber 14 or the transfer chamber 16 to thus take out the wafers W and subsequently transfer the wafers W to a position required for their being processed (ST 110).

After a wafer is processed, the controller transfers the processed wafer W back into the cassette C in the loadlock chamber 10 (ST112). The controller closes the second door 12b once all of the respective processed wafers W have been mounted in the cassette C (ST114).

Next, the control valve 26b is opened so that purge gas is supplied into the loadlock chamber 10 through the gas supply line 24 while the control valve 26a cuts off the exhaust line 20 (ST116). Furthermore, the sensing unit senses the increase in pressure in the chamber 10. Accordingly, a constant pressure equal to that prevailing in the production line is produced in the loadlock chamber 10 (ST118).

Once the pressure within the loadlock chamber 10 equals the atmospheric pressure atmosphere of the production line, the controller opens the first door 12a, and the cassette C is transferred from the loadlock chamber 10 (ST120).

As mentioned above, the valves 26a, 26b are opened and closed when changing the pressure within the loadlock chamber 10 from a vacuum pressure level to an atmospheric pressure level, or vice versa. In particular, the control valve 26b installed in the gas supply line 24 is closed and then control valve 26a installed in the exhaust line 20 is opened, when the pressure within the interior of the loadlock chamber 10 is to be reduced to the level of a vacuum. Conversely, the control valve 26a in the exhaust line 20 is closed, and the control valve 26b in the gas supply line 24 is opened when the purge gas is to be introduced into the loadlock chamber 10 to bring the pressure therein up to atmospheric pressure.

However, with respect to the former operation, the temperature of the loadlock chamber 10 is momentarily reduced to about −40° C. when the loadlock chamber 10 is suddenly exposed to the vacuum pressure and the supply of the purge gas is cut off. At this time, air and various gases remaining in the loadlock chamber 10 are solidified by the momentary temperature drop, thereby forming particles. These particles are blown around the loadlock chamber by an eddy phenomenon created by the rapid change in pressure, and thus pollute or damage the wafer(s) W and the interior of the loadlock chamber 10.

A system has been developed in an attempt to prevent such a rapid decrease in pressure within the loadlock chamber 10. This system is installed on the exhaust line and is operative to slowly reduce the pressure for a predetermined period of time at the initial stage in the operation of creating a predetermined level of vacuum pressure in the loadlock chamber. The system then gradually increases the rate at which the pressure is reduced until the predetermined level of vacuum pressure is attained.

However, such a system merely delays the time required to produce the desire level of vacuum pressure within the loadlock chamber. That is, the pressure is rapidly decreased after the lapse of a predetermined period of time, whereby an eddy phenomenon occurs in the loadlock chamber 10. Therefore, this system is still subject to the problems of the polluting and damaging of the wafers W and the loadlock chamber 10.

Meanwhile, these problems also occur in the latter case mentioned above, i.e., the changing of the pressure within the loadlock chamber 10 from a vacuum pressure level to an atmospheric pressure level. That is, various gases and particles are produced, and are entrained by an eddy created when the purge gas is suddenly supplied while the source of the vacuum pressure is cut off. Thus, the wafers W and the loadlock chamber 10 are polluted and damaged as in the former case.

SUMMARY OF THE INVENTION

Therefore, an object of the present invention is to provide a vacuum/purge operation of a loadlock chamber, which does not produce an eddy phenomenon and thereby prevents a wafer from being polluted and damaged by particles in the chamber when the state of the pressure in the loadlock chamber is changed.

In accordance with one aspect of the present invention, the vacuum/purge operation of a loadlock chamber for use in fabricating a semiconductor device includes a first step of sealing the loadlock chamber to maintain a state of pressure (vacuum pressure state or atmospheric pressure state) therein. Then, an initial procedure is performed in which the loadlock chamber is provided with vacuum pressure and purge gas are at rates that are inter-dependent. To this end, a vacuum line (or sometimes referred to herein as an "exhaust line") and a gas supply line connected to the chamber are opened to exhaust any gas in the loadlock chamber through the exhaust line as promoted by the introduction of purge gas into the chamber through the supply line. A subsequent procedure is then performed in which the rate at which one the vacuum pressure or the purge gas is being supplied is gradually reduced and then the supply is cut off. The rate at which the vacuum pressure is supplied is preferably regulated through the operation of a needle valve, whereas the rate at which the purge gas is supplied is preferably regulated through the operation of a solenoid valve.

During the first procedure, the vacuum pressure and the purge gas are supplied at rates that are gradually increased for a predetermined amount of time, all the while maintaining a mutual balance and preventing a significant change in pressure in the loadlock chamber. Also, the exhausting of the gas by providing the vacuum pressure is carried out at a rate that is greater than that at which the purge gas is supplied, when changing the state of pressure in the loadlock chamber from an atmospheric pressure state to a vacuum pressure state. Conversely, the purge gas is supplied at a greater rate than the rate at which the gas is exhausted from the chamber over a finite period of time, when changing the state of pressure in the loadlock chamber from a vacuum pressure state to an atmospheric pressure state.

Preferably, a diffuser is disposed in the loadlock chamber as connected to the gas supply line. Therefore, the purge gas will be diffused uniformly into the loadlock chamber during the vacuum/purge operation. This enhances the ability of the present invention to prevent an eddy from being formed at the time the pressure state in the loadlock chamber is to be changed.

According to one application of the present invention, when a wafer is to be transferred from a production line into processing equipment, first the wafer is introduced into a loadlock chamber from the production line. Subsequently the loadlock chamber is sealed from the production line. Then, gas in the loadlock chamber is exhausted by opening, to a certain extent, a vacuum line connected to the chamber. Simultaneously, purge gas is supplied into the chamber. The rates at which the gas is exhausted and the purge gas is supplied are inter-dependent and establish a flow of gas in the chamber in a direction towards the vacuum line.

Once the flow of gas is established, the rate at which the purge gas is being supplied into the loadlock chamber is reduced to one that is less than the rate at which gas is being exhausted from the chamber through the vacuum line. At this time, the purge gas continues to be supplied at the reduced rate, whereby the pressure in the loadlock chamber decreases.

The pressure in the loadlock chamber is monitored. Once the pressure in the loadlock chamber is substantially the same as the pressure in a chamber of the processing equipment adjacent the loadlock chamber, the wafer is transferred from the loadlock chamber to the adjacent chamber.

According to still another application of the present invention, when a wafer is to be transferred between a production line and processing equipment in the manufacturing of a semiconductor device, the loadlock chamber is sealed off from the production line. Subsequently, the wafer is introduced into a loadlock chamber from a chamber of the processing equipment adjacent the loadlock chamber. Then, the loadlock chamber is sealed off from that adjacent chamber, as well.

Next, gas in the loadlock chamber is exhausted through a vacuum line connected to the chamber and purge gas is simultaneously supplied into the chamber at respective rates that are inter-dependent. As with the previous case, a flow of gas is thus established in the chamber in a direction towards the vacuum line.

Once the flow of gas is established, the rate at which the gas is being exhausted from the loadlock chamber is reduced to one that is less than the rate at which gas is being supplied into the chamber. Gas continues to be exhausted at the reduced rate. Accordingly, the pressure in the loadlock chamber increases.

Once the pressure in the loadlock chamber is substantially the same as the pressure in the production line, the wafer is transferred from the loadlock chamber to the production line.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, preferred embodiments of the present invention will be described in detail with reference to FIGS. 1 and 3–5. Like numbers/symbols designate like parts throughout the drawings.

Figure 1:
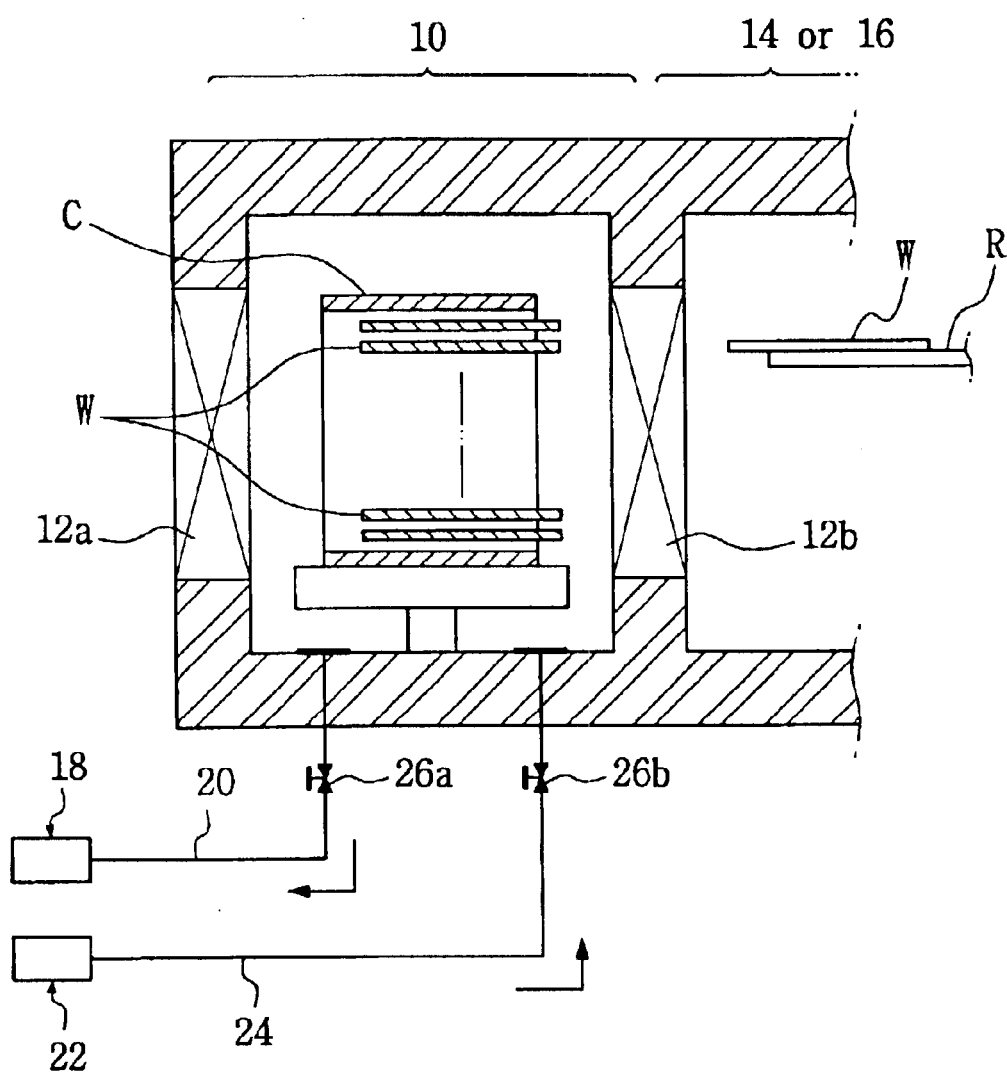
FIG. 1 is a sectional schematic view of a conventional loadlock chamber of semiconductor device manufacturing apparatus.
Figure 2:
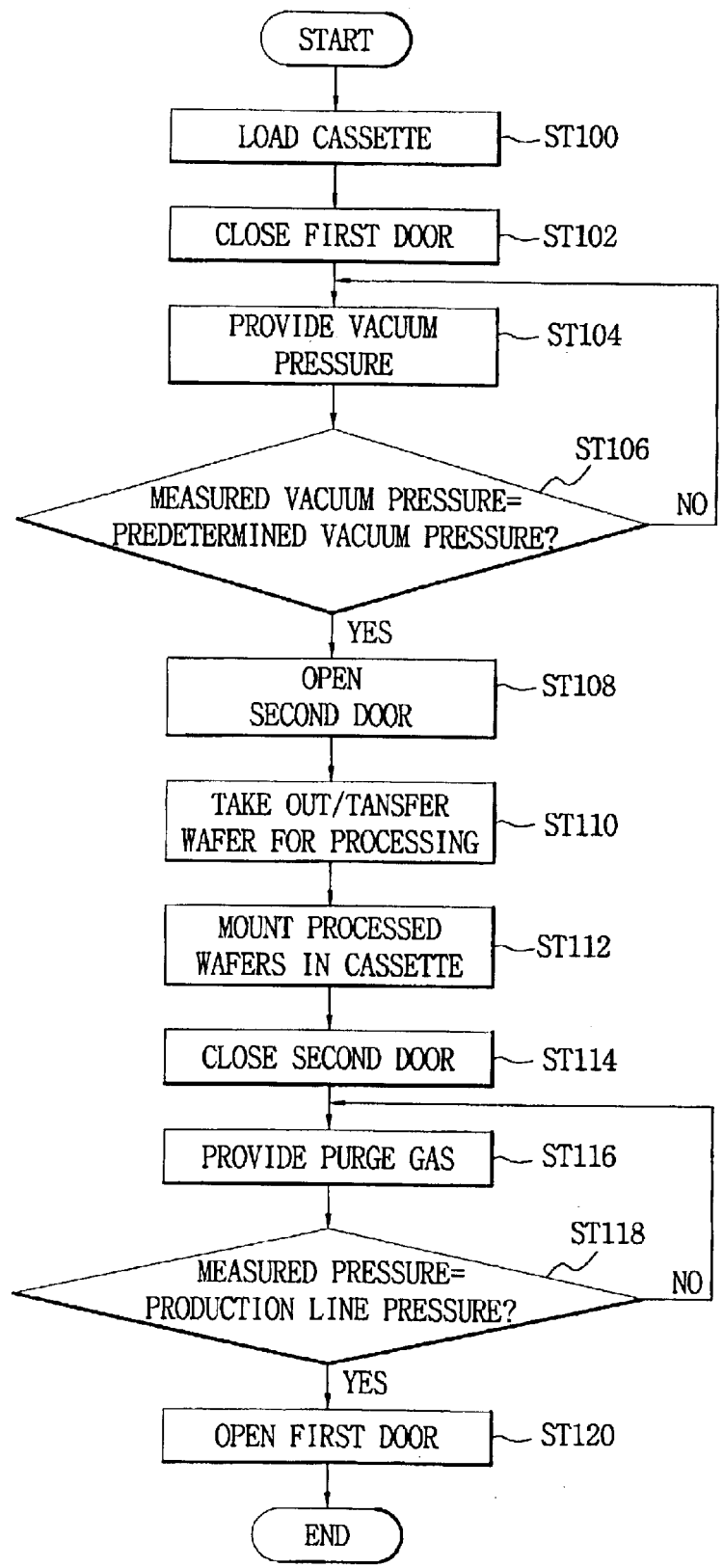
FIG. 2 is a flowchart of a conventional vacuum/purge operation of the loadlock chamber shown in FIG. 1.
Figure 3:
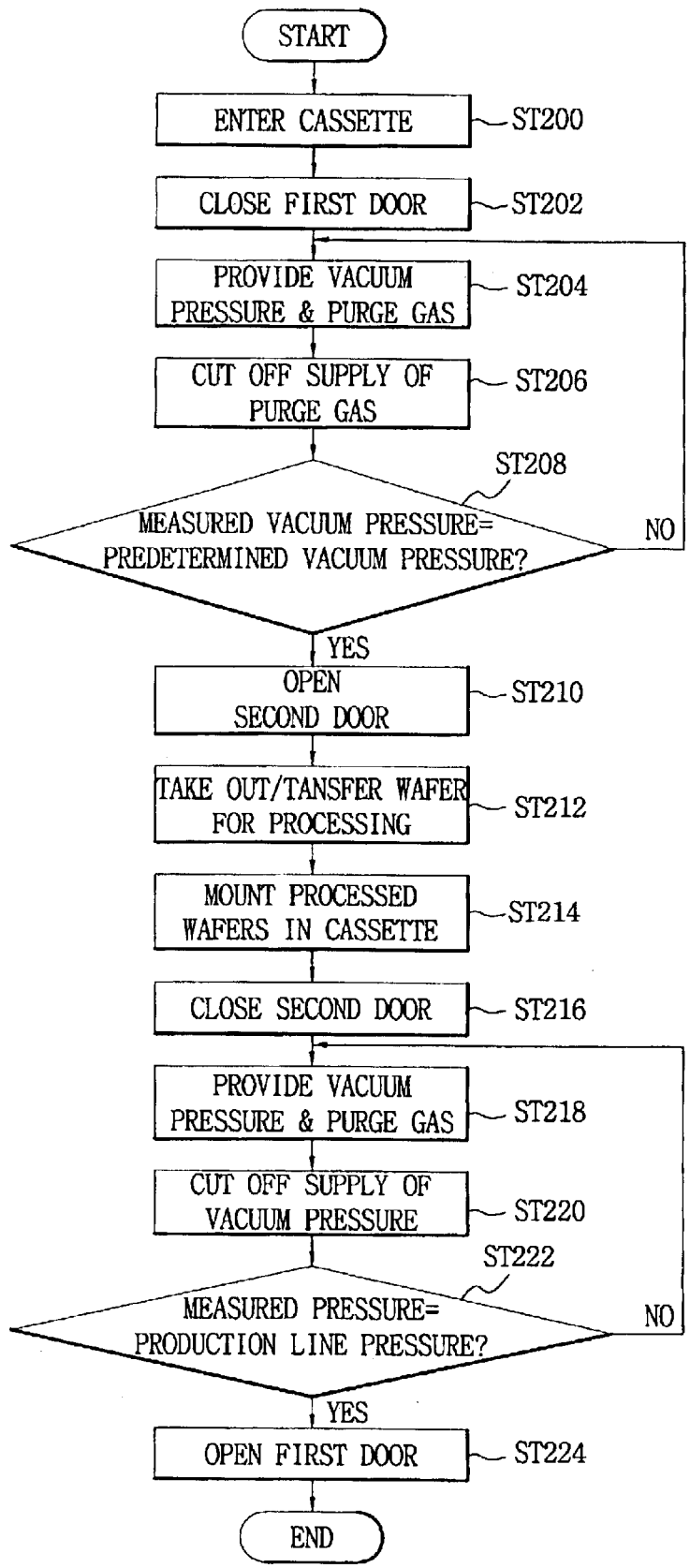
FIG. 3 is a flowchart of an embodiment of a vacuum/purge operation of a loadlock chamber in accordance with the present invention.

In the vacuum/purge operation of the loadlock chamber of the type shown in FIG. 1, the cassette C in which a plurality of wafers W are mounted is moved into the loadlock chamber 10 from the production line while the first door 12a is open (ST200). Then, the controller closes the first door 12a to thus seal the atmosphere within the loadlock chamber 10 (ST202).

Figure 4:
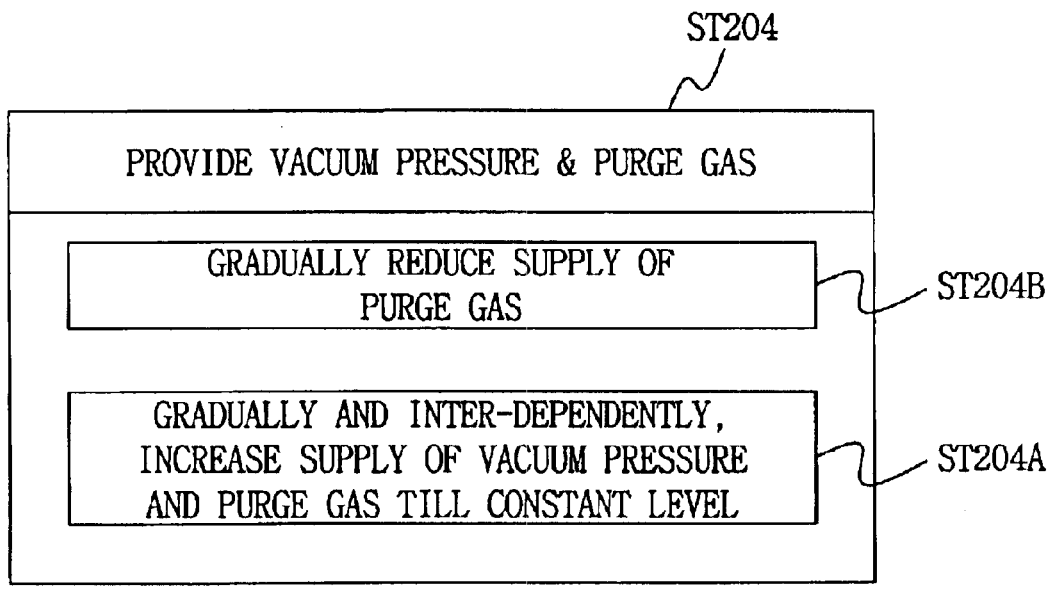
FIG. 4 is a block diagram of a vacuum pressure and purge gas step in the method of FIG. 3.
Figure 5:
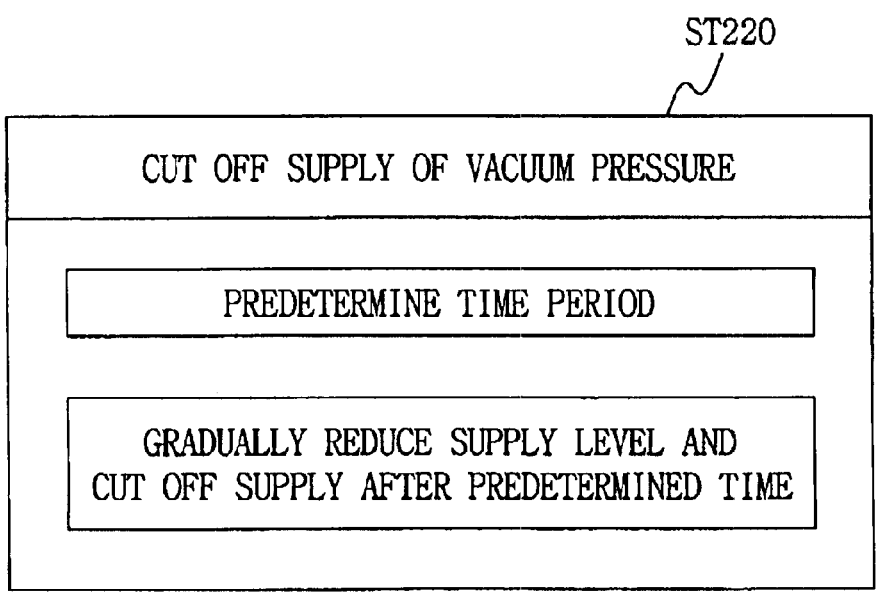
FIG. 5 is a block diagram of a step of cutting off the supplying of vacuum pressure, in the method of FIG. 3, to form an atmospheric pressure within the loadlock chamber.

Next, the controller controls both the control valve 26b installed in the gas supply line 24, and the control valve 26a installed in the exhaust (vacuum) line 20 to thus provide the loadlock chamber 10 with purge gas and vacuum pressure (ST204). At this time, the valves 26a, 26b are controlled to prevent a rapid change in pressure in the loadlock chamber 10, i.e., to prevent an eddy phenomenon from occurring in the chamber. To this end, as shown in FIG. 4, the purge gas and the vacuum pressure are simultaneously and inter-dependently introduced into the loadlock chamber 10 such that any gas already in the loadlock chamber 10, as well as the purge gas, will naturally flow in the direction of the exhaust line 20. Furthermore, the amounts of the purge gas and the vacuum pressure are gradually increased so as to maintain a mutual balance that minimizes pressure changes within the loadlock chamber, until the time the purge gas and the gases already in the loadlock chamber 10 are flowing uniformly into the exhaust line 20 without creating an eddy (ST204A). In addition, the purge gas is supplied more quickly than the vacuum pressure over predetermined period of time, preferably about 0.1□1.5 sec., thereby further facilitating the flow of the gases in the desired direction of the exhaust line 20. Once the amounts of the purge gas and the vacuum pressure being supplied reach certain levels, respectively, the controller gradually reduces the amount of the purge gas being supplied (ST204B).

The supply of the purge gas is cut off after a predetermined period of time has elapsed from once the controller begins to gradually reduce the supply of the purge gas (ST206).

Figure 6:
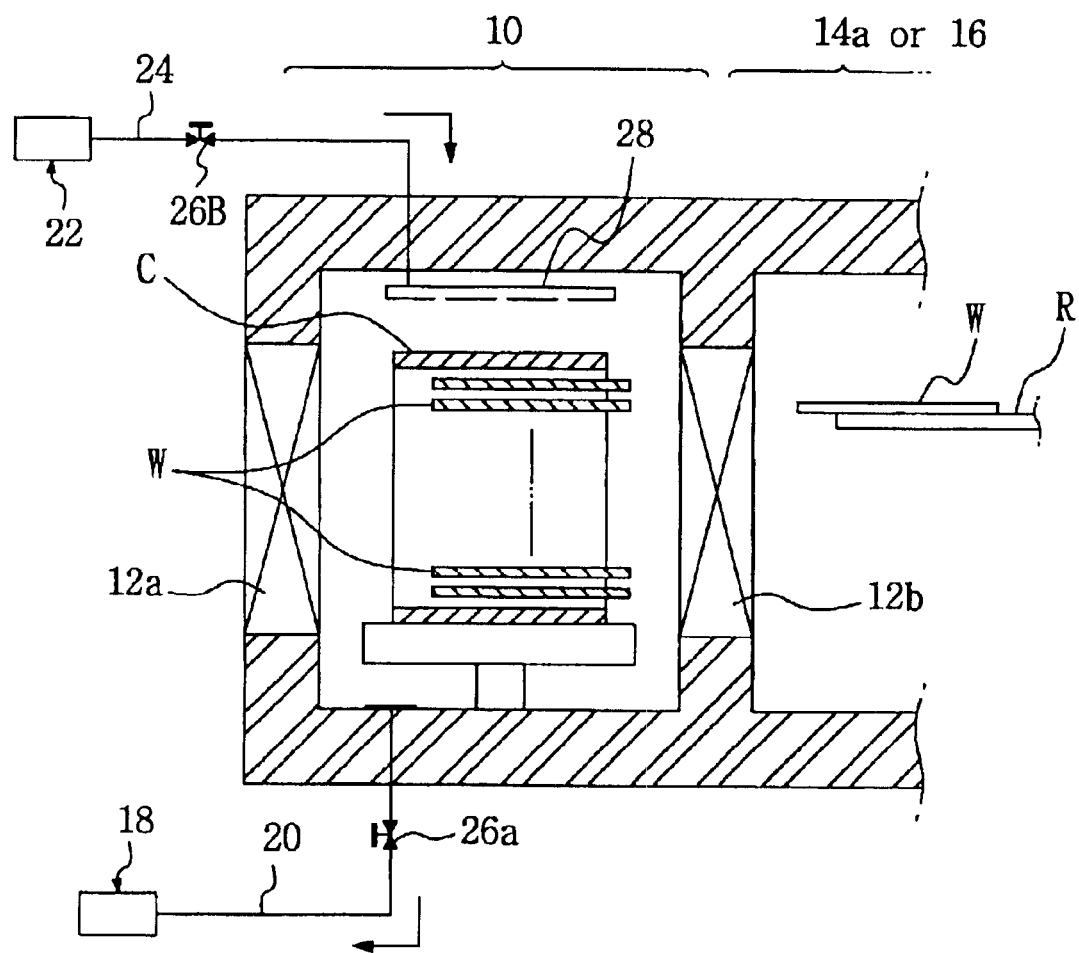
FIG. 6 is a sectional schematic view of a loadlock chamber of semiconductor device manufacturing apparatus having a purge gas diffuser according to the present invention.

Heretofore, the purge gas is supplied to cause the various gases in the loadlock chamber 10 to flow in the direction of and into the exhaust line 20. To this end, the loadlock chamber 10 can be equipped with a diffuser 28 that is capable of uniformly diffusing the purge gas in the loadlock chamber 10 and directing the flow of the purge gas toward the exhaust line 20 (see FIG. 6). In any case, even though the amount of the purge gas being supplied is gradually reduced and the supply is finally cut off, the gas in the loadlock chamber 10 continues to flow in the desired direction towards and into the exhaust line 20.

The controller monitors the pressure in the loadlock chamber 10 using a sensing unit at the time the supply of the purge gas is cut off and the vacuum pressure continuous to be provided (ST208). If the pressure has not reached a predetermined vacuum pressure level, namely, a level corresponding to that in the process chamber 14 or transfer chamber 16, the vacuum pressure continues to be provided with the supply of the purge gas cut off. Once the interior pressure of the loadlock chamber 10 reaches the predetermined vacuum pressure level, the controller cuts off the supply of vacuum pressure, opens the second door 12b (ST210), and controls the robot R provided in the adjacent process chamber 14 or transfer chamber 16 to remove a wafer W from the cassette and transfer the wafer W to a position required for subsequent processing (ST212). Then, the controller transfers the wafer/wafers W that has/have already been processed back into the cassette C in the loadlock chamber 10 (ST214).

Next, the controller closes the second door 12b once all of the respective wafers W that have entered the loadlock chamber 10 through the above-mentioned procedures have been processed and mounted back in the cassette C (ST216). Accordingly, the atmosphere within the loadlock chamber 10 is again sealed.

Subsequently, the controller controls the control valve 26a installed in the exhaust line 20, and the control valve 26b installed in the gas supply line 24, so as to simultaneously provide the loadlock chamber 10 with purge gas and vacuum pressure (ST218).

Such an inter-dependent control of the valves 26a, 26b is in preparation for changing the vacuum pressure state in the loadlock chamber 10 to atmospheric pressure. As in the procedure of forming the vacuum pressure state in the loadlock chamber, the forming the atmospheric pressure state is effected by first gradually increasing the amount of the purge gas and the vacuum pressure in a mutually balanced manner for a given period of time (ST218). Accordingly, the pressure in the loadlock chamber 10 changes without producing an eddy of the various gases remaining in the loadlock chamber 10. Subsequently, the controller controls the control valve 26a to gradually reduce the level of the vacuum pressure being supplied, and to finally cut off the supply of vacuum pressure after a predetermined period of time (ST220 and FIG. 5).

The vacuum pressure can be regulated in these ways by controlling the speed at which the control valve 26a is opened and closed. Also, the control valve 26a can employ a needle valve to effect such a control of the rate at which the vacuum pressure is supplied. On the other hand, the control valve 26b provided in the purge gas supply line 24 may be merely a solenoid valve.

Through such procedures, the purge gas is stably supplied into the loadlock chamber 10. Furthermore, various harmful gases that have flown into the loadlock chamber 10 when the second door 12b was opened are exhausted through the exhaust line 20. The flow of these harmful gases towards the exhaust line 20, i.e., the purging of the loadlock chamber 10, is facilitated by the supplying of the purge gas.

Also, the continuous supply of the purge gas increases the pressure in the loadlock chamber 10. During this time, the controller checks the pressure in the loadlock chamber 10 using the sensing unit (ST222). The controller cuts off the supply of purge gas and opens the first door 12a when the pressure in the loadlock chamber 10 equals the pressure prevailing in the production line (ST224). Then, the cassette C in which the wafers W are mounted is taken out of the loadlock chamber 10.

According to the present invention, the vacuum pressure and the purge gas are provided inter-dependently and at the same time when the pressure state in the loadlock chamber 10 is to be changed, i.e., from a vacuum pressure state to an atmospheric pressure state or vice versa. Then, depending on the case, either the purge gas or the vacuum pressure level is gradually reduced for a predetermined period of time, and is then cut off. Accordingly, the desired pressure is produced in the loadlock chamber without an eddy that can otherwise entrain particles and damage or pollute the wafers W and the chamber.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. A method of changing the state of pressure in a loadlock chamber, said method comprising:

sealing the loadlock chamber so that the state of pressure prevailing in the loadlock chamber is maintained therein;

once the loadlock chamber has been sealed and while the state of pressure prevailing therein is thus being maintained, an initial procedure of exhausting gas in the chamber through a vacuum line connected to the chamber and simultaneously supplying purge gas into the chamber at respective rates that are inter-dependent; and a subsequent procedure of reducing one of the rates at which the gas is being exhausted through the vacuum line and the purge gas is being supplied into the chamber without reducing the other of the rates, and thereafter stopping that one of the exhausting of the gas from the chamber and the supplying of the purge gas into the chamber whose rate was reduced.

2. The method of claim 1, wherein said initial procedure comprises increasing the rates at which the gas is exhausted from the chamber and the purge gas is supplied to the chamber for a predetermined period of time.

3. The method of claim 1, wherein the pressure state prevailing in the loadlock chamber at the time the loadlock chamber is sealed is a vacuum pressure state, and wherein the gas is exhausted from the chamber at a rate lesser than that at which the purge gas is supplied into the chamber for a finite period of time sufficient to change the vacuum pressure state in the loadlock chamber to an atmospheric pressure state.

4. The method of claim 1, wherein the pressure state prevailing in the loadlock chamber at the time the loadlock chamber is sealed is an atmospheric pressure state, and wherein the purge gas is supplied into the chamber at a rate lesser than that at which the gas is exhausted from the chamber for a finite period of time sufficient to change the atmospheric pressure state in the loadlock chamber to a vacuum pressure state.

5. The method of claim 1, wherein the exhausting of gas from the loadlock chamber comprises controlling the position of a needle valve connected to the exhaust line.

6. The method of claim 1, wherein said supplying of purge gas into the loadlock chamber comprises operating a solenoid valve connected to a supply line communicating with the loadlock chamber.

7. The method of claim 1, wherein the pressure state prevailing in the loadlock chamber at the time the loadlock chamber is sealed is a vacuum pressure state, and wherein the exhausting of gas from the loadlock chamber comprises controlling the rate of operation of a control valve connected to the exhaust line in changing the vacuum pressure state to an atmospheric pressure state.

8. The method of claim 1, wherein in said subsequent procedure, the exhausting of gas through the vacuum line or the supplying of the purge gas into the chamber at a reduced rate is carried out for a predetermined period of time before being stopped.

9. The method of claim 1, wherein said supplying of purge gas into the loadlock chamber comprises uniformly diffusing the purge gas throughout the loadlock chamber.

10. A method of transferring a wafer between a production line and processing equipment in the manufacturing of a semiconductor device, said method comprising:

introducing the wafer into a loadlock chamber from the production line;

subsequently sealing the loadlock chamber from the production line;

subsequently exhausting gas in the loadlock chamber through a vacuum line connected to the chamber and simultaneously supplying purge gas into the chamber at respective rates that are inter-dependent and establish a flow of gas in the chamber in a direction towards the vacuum line;

once said flow of gas is established, reducing the rate at which the purge gas is being supplied into the loadlock chamber to one that is less than the rate at which gas is being exhausted from the chamber through the vacuum line, and continuing to supply the purge gas at the reduced rate, whereby the pressure in the loadlock chamber decreases;

monitoring the pressure in the loadlock chamber; and once the pressure in the loadlock chamber is substantially the same as the pressure in a chamber of the processing equipment adjacent the loadlock chamber, transferring the wafer from the loadlock chamber to the adjacent chamber.

11. The method of claim 10, and further comprising stopping the supplying of the purge gas into the loadlock chamber upon the lapse of a finite time after the rate at which the purge gas is being supplied into the loadlock chamber has been reduced.

12. The method of claim 10, wherein said supplying of purge gas into the loadlock chamber comprises uniformly diffusing the purge gas throughout the loadlock chamber.

13. A method of transferring a wafer between a production line and processing equipment in the manufacturing of a semiconductor device, said method comprising:

sealing the loadlock chamber from the production line;

subsequently introducing the wafer into a loadlock chamber from a chamber of the processing equipment adjacent the loadlock chamber;

subsequently sealing the loadlock chamber from the adjacent chamber;

subsequently exhausting gas in the loadlock chamber through a vacuum line connected to the chamber and simultaneously supplying purge gas into the chamber at respective rates that are inter-dependent and establish a flow of gas in the chamber in a direction towards the vacuum line;

once said flow of gas is established, reducing the rate at which the gas is being exhausted from the loadlock chamber to one that is less than the rate at which gas is being supplied into the chamber, and continuing to exhaust the gas at the reduced rate, whereby the pressure in the loadlock chamber increases;

monitoring the pressure in the loadlock chamber; and once the pressure in the loadlock chamber is substantially the same as the pressure in the production line, transferring the wafer from the loadlock chamber to the production line.

14. The method of claim 13, and further comprising stopping the exhausting of the purge gas from the loadlock chamber upon the lapse of a finite time after the rate at which the gas is being exhausted from the loadlock chamber has been reduced.

* * * * *